US012748240B2

(12) United States Patent
Hansen et al.

(10) Patent No.: US 12,748,240 B2
(45) Date of Patent: Sep. 29, 2026

(54) OPTICAL DEVICES INCLUDING METASTRUCTURES AND METHODS FOR FABRICATING THE OPTICAL DEVICES

(71) Applicant: NIL Technology ApS, Kongens Lyngby (DK)

(72) Inventors: Jesper Fly Hansen, Copenhagen (DK); Villads Egede Johansen, Copenhagen (DK); Maksim Zalkovskij, Copenhagen (DK); Brian Bilenberg, Ølstykke (DK); James Eilertsen, Skodsborg (DK)

(73) Assignee: NIL Technology ApS, Kongens Lyngby (DK)

( * ) Notice: Subject to any disclaimer, the term of this patent is extended or adjusted under 35 U.S.C. 154(b) by 0 days.

(21) Appl. No.: 18/670,047

(22) Filed: May 21, 2024

(65) Prior Publication Data

US 2024/0302568 A1 Sep. 12, 2024

Related U.S. Application Data

(62) Division of application No. 18/010,874, filed as application No. PCT/EP2021/066208 on Jun. 16, 2021, now Pat. No. 12,541,040.

(Continued)

(51) Int. Cl.

*G02B 1/00* (2006.01)
*B29D 11/00* (2006.01)

(Continued)

(52) U.S. Cl.

CPC .......... *G02B 1/002* (2013.01); *B29D 11/0074* (2013.01); *C23C 16/042* (2013.01);

(Continued)

(58) Field of Classification Search

CPC .................. G02B 1/002; G02B 5/1857; G02B 2207/101; B29D 11/0074; C23C 16/042; C23C 16/45525

(Continued)

(56) References Cited

U.S. PATENT DOCUMENTS

| | | | |
|---|---|---|---|
| 2007/0279745 A1 | 12/2007 | Klemann | |
| 2017/0030773 A1 | 2/2017 | Han et al. | |

(Continued)

FOREIGN PATENT DOCUMENTS

| | | |
|---|---|---|
| JP | 2008-032794 A | 2/2008 |
| JP | 2011128259 | 6/2011 |

(Continued)

OTHER PUBLICATIONS

WO 2020196168 A1 (Year: 2020).*

(Continued)

*Primary Examiner* — William Choi

(74) *Attorney, Agent, or Firm* — Fish & Richardson P.C.

(57) ABSTRACT

Methods of manufacturing an optical device can include, in some implementations, providing a substrate having a first polymeric layer on a surface of the substrate and a second polymeric layer on the first polymeric layer, forming first openings in the second polymeric layer to define an etch mask composed of material of the second polymeric layer, and etching to form second openings in the first polymeric layer, wherein locations of the second openings are defined by the etch mask. A material is deposited in the second openings to form meta-atoms of a first metastructure, wherein adjacent ones of the meta-atoms are separated from one another by polymeric material of the first polymeric layer. Optical devices including metastructures can be formed, where meta-atoms of the metastructure have a relatively high aspect ratio.

11 Claims, 12 Drawing Sheets

Related U.S. Application Data

(60) Provisional application No. 63/040,927, filed on Jun. 18, 2020.

(51) Int. Cl.
*C23C 16/04* (2006.01)
*G02B 5/18* (2006.01)
*C23C 16/455* (2006.01)

(52) U.S. Cl.
CPC ...... *G02B 5/1857* (2013.01); *C23C 16/45525* (2013.01); *G02B 2207/101* (2013.01)

(58) Field of Classification Search
USPC .......................................................... 359/237
See application file for complete search history.

(56) References Cited

U.S. PATENT DOCUMENTS

| | | | |
|---|---|---|---|
| 2017/0345643 | A1 | 11/2017 | Younkin et al. |
| 2018/0217395 | A1 | 8/2018 | Lin et al. |
| 2019/0025463 | A1 | 1/2019 | She et al. |
| 2019/0064532 | A1 | 2/2019 | Riley et al. |
| 2019/0206136 | A1 | 7/2019 | West et al. |
| 2019/0318957 | A1 | 10/2019 | Godet et al. |
| 2020/0256725 | A1 | 8/2020 | Han et al. |
| 2020/0271941 | A1 | 8/2020 | Riley, Jr. et al. |
| 2022/0404525 | A1 | 12/2022 | Wolk et al. |
| 2023/0194757 | A1 | 6/2023 | Hansen et al. |
| 2023/0228910 | A1 | 7/2023 | Hansen et al. |

FOREIGN PATENT DOCUMENTS

| | | | |
|---|---|---|---|
| JP | 2020-056973 | A | 4/2020 |
| KR | 20200025994 | A | 3/2020 |
| WO | WO 2014023415 | | 2/2014 |
| WO | WO 2018215774 | | 11/2018 |
| WO | WO 2020214615 | | 10/2020 |
| WO | WO 2021133250 | | 7/2021 |

OTHER PUBLICATIONS

Huang et al., "A novel PMMA/NEB bilayer process for sub-20 nm gold nanoslits by a selective electron beam lithography and dry etch," Microelectronic Engineering, Feb. 10, 2017, 172:13-18.
Boltasseva et al., "Low-loss plasmonic metamaterials," Science, 2011, 331(6015):290-291.
Guler et al., "Refractory Plasmonics," Science, 2014, 344(6181):263-264.
International Preliminary Report on Patentability in International Appln. No. PCT/EP2021/063004, dated Dec. 1, 2022, 10 pages.
International Preliminary Report on Patentability in International Appln. No. PCT/EP2021/066208, dated Dec. 29, 2022, 9 pages.
International Search Report and Written Opinion in International Appln. No. PCT/EP2021/063004, dated Oct. 6, 2021, 16 pages.
International Search Report and Written Opinion in International Appln. No. PCT/EP2021/066208, dated Sep. 28, 2021, 12 pages.
Li et al., "Refractory plasmonics with titanium nitride: broadband metamaterial absorber," Advanced Materials, 2014, 26(47):7959-7965.
Office Action in Korean Appln. No. 20227043698, mailed on Feb. 18, 2025, 12 pages (with English translation).
Office Action in Korean Appln. No. 10-2023-7001515, mailed on Nov. 7, 2025, 14 pages (with English translation).

* cited by examiner

OPTICAL DEVICES INCLUDING METASTRUCTURES AND METHODS FOR FABRICATING THE OPTICAL DEVICES

CROSS-REFERENCE TO RELATED APPLICATIONS

This application is a divisional and claims priority to U.S. patent application Ser. No. 18/010,874 filed Dec. 16, 2022, which is a National Stage Application under 35 U.S.C. § 371 and claims the benefit of International Application No. PCT/EP2021/066208, filed Jun. 16, 2021, which claims priority to U.S. Application No. 63/040,927, filed Jun. 18, 2020, the disclosures of which are incorporated herein by reference.

FIELD OF THE DISCLOSURE

The present disclosure relates to optical devices that include one or more metastructures.

BACKGROUND

A metasurface refers to a surface with distributed small structures (e.g., meta-atoms) arranged to interact with light in a particular manner. For example, a metasurface can be a surface with a distributed array of nanostructures. The nanostructures may, individually or collectively, interact with light waves. For example, the nanostructures or other meta-atoms may change a local amplitude, a local phase, or both, of an incoming light wave.

SUMMARY

The present disclosure describes optical devices that include one or more metastructures, and methods of manufacturing the metastructures. Optical devices incorporating one or more of the metastructures may be integrated into modules that house one or more optoelectronic devices (e.g., light emitting and/or light sensing devices). The metastructure can be used, for example, to modify one or more characteristics (e.g., phase, amplitude, angle, etc.) of an emitted or incoming light wave as it passes through the metastructure.

In some implementations, the techniques can facilitate formation of metastructures in which the meta-atoms have a relatively high aspect ratio (e.g., the height of an individual meta-atom is greater than, and in some cases significantly greater than, the width or diameter of the meta-atom). In some instances, the optical device may provide greater mechanical stability for the metastructure and/or may help protect the metastructure from physical, chemical and/or environmental degradation.

For example, in one aspect, the present disclosure describes a method of manufacturing an optical device that includes providing a substrate having a first polymeric layer on a surface of the substrate and a second polymeric layer on the first polymeric layer, forming first openings in the second polymeric layer to define an etch mask composed of material of the second polymeric layer, and etching to form second openings in the first polymeric layer, wherein locations of the second openings are defined by the etch mask. A material is deposited in the second openings to form meta-atoms of a first metastructure, wherein adjacent ones of the meta-atoms are separated from one another by polymeric material of the first polymeric layer.

Some implementations include one or more of the following features. For example, in some instances, the etching is performed using an etchant that preferentially etches the first polymeric material at a higher etch rate than the etchant etches the second polymeric layer. In some cases, the etching continues until the mask composed of the second polymeric layer is removed. In some cases, the methods can facilitate fabrication of optical devices having metastructures in which the meta-atoms have, for example, an aspect ratio of at least 1.6. In some implementations, the first polymeric is composed of poly(methyl methacrylate).

In accordance with some implementations, the second polymeric layer is composed of photoresist. The first openings in the second polymeric layer may be formed, for example, using a photolithographic technique or by imprinting. In some instances, the material deposited in the second openings to form the meta-atoms includes $TiO_2$. The material can be deposited in the second openings of the first polymeric layer, for example, by atomic layer deposition.

In some implementations, the method includes providing a third polymeric layer over the first metastructure, and forming a second metastructure in the third polymeric layer. Forming the second metastructure may include, for example, providing a fourth polymeric layer on the third polymeric layer, forming third openings in the fourth polymeric layer to define a second etch mask composed of material of the fourth polymeric layer, etching to form fourth openings in the third polymeric layer, wherein locations of the fourth openings are defined by the second etch mask, and depositing a material in the fourth openings to form meta-atoms of the second metastructure, wherein adjacent ones of the meta-atoms of the second metastructure are separated from one another by polymeric material of the third polymeric layer. In some cases, an arrangement of the meta-atoms of the second metastructure differs from an arrangement of the meta-atoms of the first metastructure. In some implementations, at least one of materials, dimensions or optical characteristics of the second metastructure differ from materials, dimensions or optical characteristics of the first metastructure.

The present disclosure also describes an optical device that includes one or more metastructures. For example, an optical device can include a substrate, and a first metastructure disposed on the substrate. The first metastructure includes a plurality of meta-atoms separated from one another by polymeric material, wherein each of the meta-atoms has an aspect ratio of at least 1.6.

Some implementations include one or more of the following features. For example, in some cases, the polymeric material comprises poly(methyl methacrylate), the meta-atoms are composed of titanium dioxide and/or the substrate is composed of fused silica.

The present disclosure also describes modules that include an optical device having a metastructure. The modules may include light emitting components, light sensing components, or both light emitting and light sensing components. The metastructure(s) may be disposed so as to intersect an emitted or incoming light wave and to modify one or more characteristics (e.g., phase, amplitude, angle, etc.) of the emitted or incoming light wave as it passes through the metastructure.

Other aspects, features and advantages will be apparent form the following detailed description, the accompanying drawings, and the claims.

DETAILED DESCRIPTION

When meta-atoms (e.g., nanostructures) of a metasurface are in a particular arrangement, the metasurface may act as an optical element such as a lens, lens array, beam splitter, diffuser, polarizer, bandpass filter, or other optical element. In some instances, metasurfaces may perform optical functions that are traditionally performed by refractive and/or diffractive optical elements. The meta-atoms may be arranged, in some cases, in a pattern so that the metastructure functions, for example, as a lens, grating coupler or other optical element. In other instances, the meta-atoms need not be arranged in a pattern, and the metastructure can function, for example, as a fanout grating, diffuser or other optical element. In some implementations, the metasurfaces may perform other functions, including polarization control, negative refractive index transmission, beam deflection, vortex generation, polarization conversion, optical filtering, and plasmonic optical functions.

In some applications, contaminants on the nanostructures may damage the nanostructures mechanically and/or chemically, or may impair the proper optical functioning of the nanostructures. Inoperable nanostructures may, besides leading to a non-working device, compromise safety. For example, a laser beam may be deflected, by a drop of water on a metasurface, into an eye of a user. As another example, a wet metasurface may have a changed refractive index surrounding the metasurface, and the changed refractive index may alter the optical properties of the metasurface, leading to collimated light passing through the metasurface and into an eye of a user.

The present disclosure describes techniques that, in some instances, facilitate formation of metastructures in which the meta-atoms have a relatively high aspect ratio (e.g., the height of an individual meta-atom is greater than, and in some cases significantly greater than, the width or diameter of the meta-atom). In some implementations, the techniques can help provide greater mechanical stability for the metastructure and also may help protect the metastructure from physical, chemical and/or environmental degradation. As described below, such metastructures can include a polymeric material disposed between the individual nanostructures, or other meta-atoms, of the metastructure. Thus, each of the individual nanostructures, for example, can be surrounded laterally by the polymeric material. Further, in some instances, a protective layer of polymeric material is provided over the metastructure.

FIGS. 1A-1H illustrate manufacturing steps for forming an optical device that includes a metastructure.

Figure 1A:
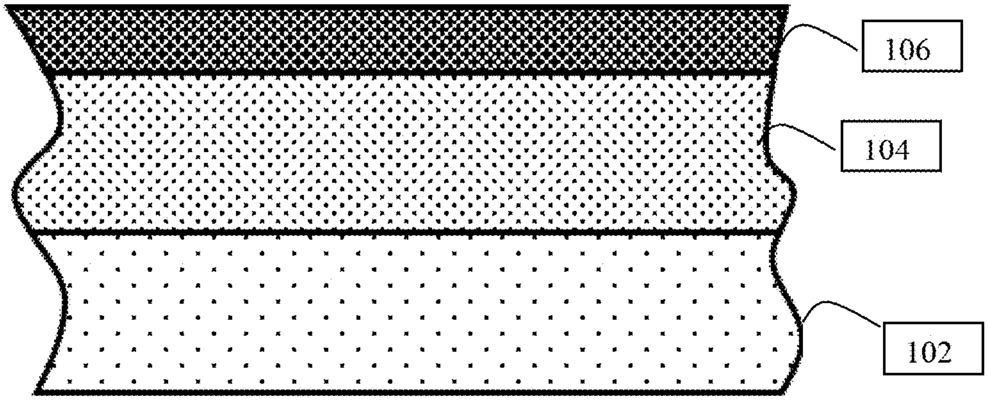
FIGS. 1A-1H illustrate a method of fabricating an optical device that includes an embedded metastructure.

As illustrated in FIG. 1A, a substrate 102 has a first polymeric layer 104 deposited on its surface. A second polymeric layer 106 is disposed on the first polymeric layer 104 such that the first polymeric layer 104 is sandwiched between the substrate 102 and the second polymeric layer 106. The substrate may be selected to be optically transmissive with respect to a particular wavelength or range of wavelengths of radiation (e.g., infra-red (IR) or visible light) depending on the application(s) in which the metastructure is to be used. For example, in some instances, the substrate 102 may be composed of fused silica. Different materials may be suitable for other implementations. In some cases, the substrate 102 may be composed of reflective material.

In some cases, one or both of the polymeric layers 104, 106 are applied by a spin-on processes. For applications in which a metastructure having high-aspect meta-atoms is to be fabricated, the material for the second polymeric layer 106 preferably should be more resistant to etching by a specified etchant than the material for the first polymeric layer 104. Thus, in some cases, the first polymeric layer 104 is susceptible to etching at a first rate R1 that is greater than the etch rate R2 at which the second polymeric layer 106 etches for a given etchant. An example material for the first polymeric layer 104 is poly(methyl methacrylate) ("PMMA"). An example material for the second polymeric layer 106 is a photoresist. Other polymeric materials may be suitable for the first or second polymeric materials in some implementations. Further details will become apparent in connection with the description of FIGS. 1C and 1D, below.

As described in greater detail below, an arrangement of openings corresponding to the locations of the meta-atoms is formed in the first polymeric layer 104. To accomplish this, the second polymeric layer 106 is processed to form a mask for a subsequent etching step during which openings in the first polymeric layer 104 are formed.

Figure 1B:
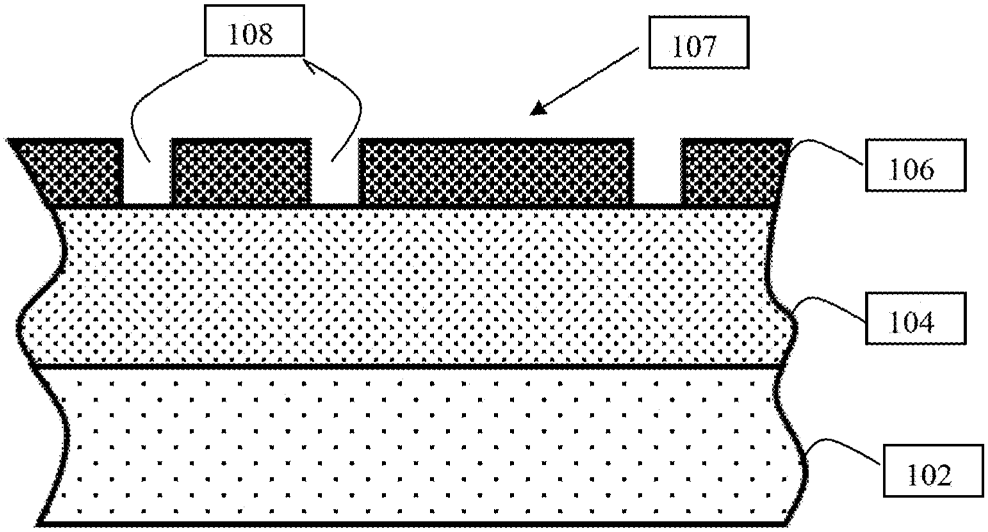

As illustrated in FIG. 1B, if the second polymeric layer 106 is composed of a photoresist, the photoresist can be processed, for example, by standard photolithographic techniques to define a mask 107 having openings 108. In other implementations (e.g., regardless of whether or not the second polymeric layer 106 is composed of photoresist or another material), the openings 108 in the second polymeric layer 106 can be formed by an imprinting technique. For example, the second polymeric layer 106 can be imprinted using a stamp having an arrangement of features that project toward the substrate 102. The arrangement of features on the imprinting stamp represents an inverse image of the desired arrangement of openings 108. The stamp can be brought into contact with the upper surface of the polymeric layer 106 and can be pressed towards the substrate 102. The imprinting imparts an inverse image of the features on the stamp into the second polymeric layer 106, thereby creating the openings 108 of the mask 107. In some implementations, the imprinting process involves embossing or replication. Prior to separating the imprinting stamp from the second polymeric layer 106, the second polymeric layer 106 may be cured (for example, using an ultraviolet (UV) flash cure in the case of photoresist; or a thermal cure). In general, the openings 108 in the second polymeric layer 106 will extend down to the upper surface of the first polymeric layer 104; however, in some instances, a thin layer of the material of the second polymeric layer 106 may remain in the openings following formation of the mask 107.

Figure 1C:
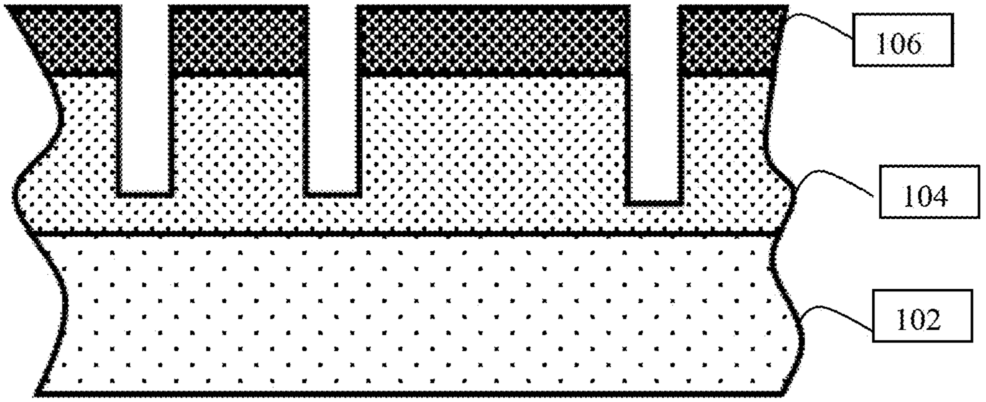
Figure 1D:
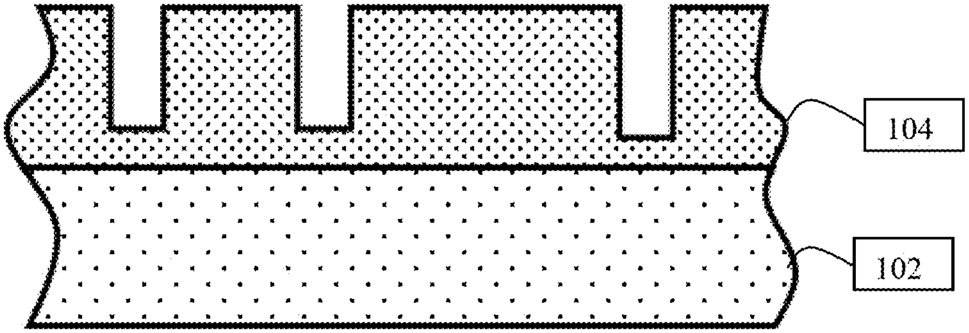

Next, as shown in FIGS. 1C and 1D, the remaining material of the second polymeric layer 106, as well as the exposed material of the first polymeric layer 104, is etched to form an arrangement of openings 110 in the first polymeric layer 104. In some instances, the etching continues until the second polymeric layer 106 is entirely removed. The etching then may be stopped, although in some instances the etching may continue a little longer. The openings 110 correspond to the locations of the meta-atoms that subsequently are to be formed. As noted above, preferably, the etchant for the foregoing etch process etches the material of the first polymeric layer 104 more quickly than it etches the mask 107 (i.e., the remaining material of the second polymeric layer 106). Examples of suitable etchants include a pure oxygen ($O_2$)-based dry etch or an $O_2$-based dry etch process that includes a small amount of fluorine. Other etchants may be appropriate for some implementations.

The asymmetry in the etch rates of the first and second polymeric layers 104, 106 can facilitate formation of openings 110 that have a relatively high aspect ratio (i.e., a height greater than its width or diameter). For example, in some instances, the openings 110 have lateral dimensions in the range of 60 nm to 400 nm, and a depth in the range of 500 nm to 1 μm, or more. In some instances, the openings 110 have an aspect ratio of at least 1:6. The foregoing dimensions may differ for some implementations.

Figure 1E:
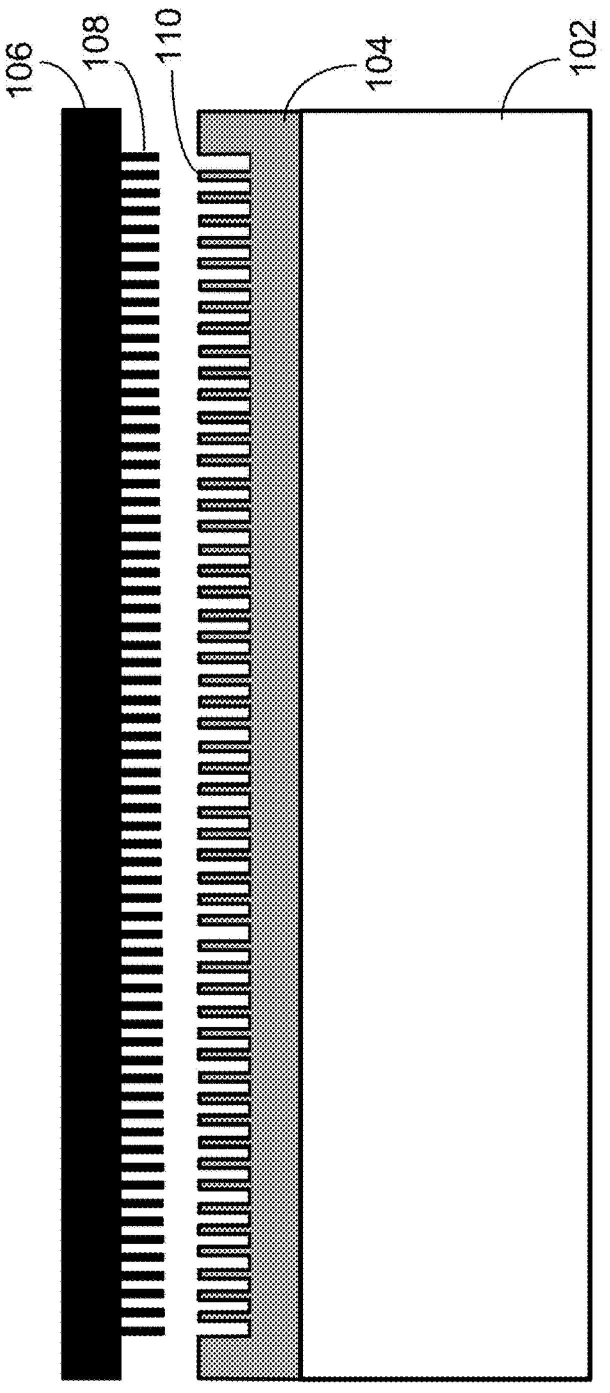

In some implementations, after the etching, a thin layer of polymeric material 104A may remain between the surface of the substrate 102 and the openings 110 in the polymeric layer 104 (FIG. 1D). FIG. 1E shows a larger section of the substrate 102 following formation of the openings 110 in the first polymeric layer 104.

Figure 1F:
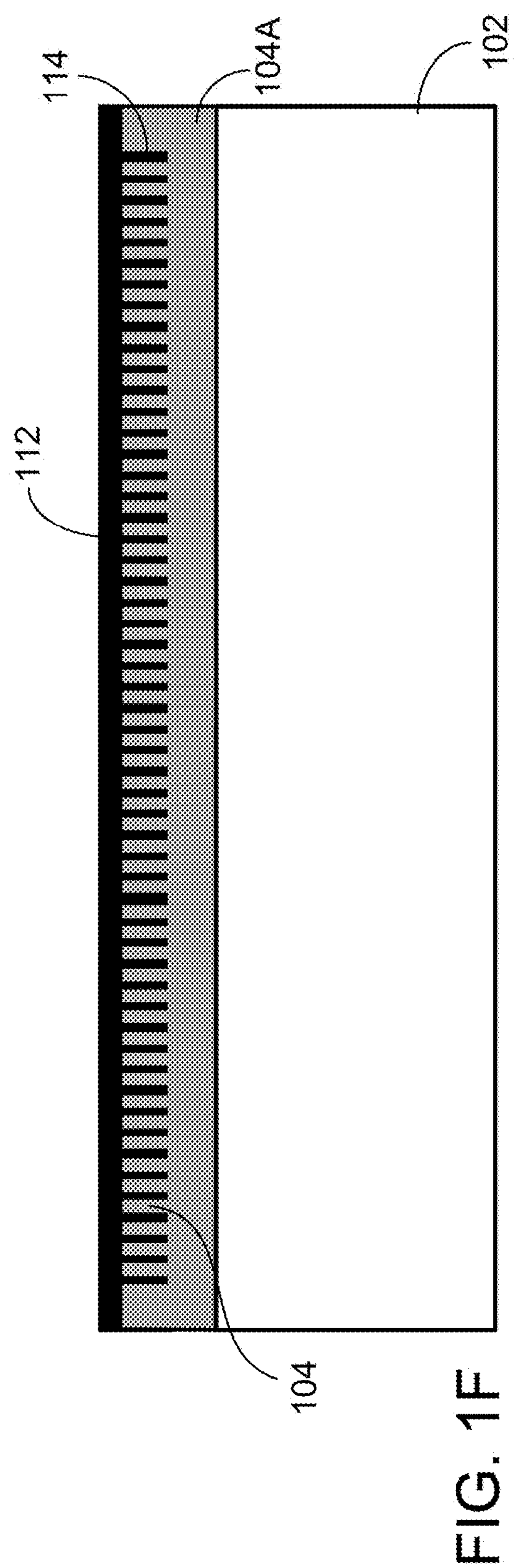

Next, as shown in FIG. 1F, a metamaterial 112 is deposited over the polymeric layer 104 so as to fill the openings 110 and form the individual meta-atoms 114 of the metastructure. The metamaterial 112 can be deposited, for example, by atomic layer deposition (ALD). A suitable metamaterial 112 for the meta-atoms 114 is titanium dioxide ($TiO_2$), which has a high refractive index relative to the material that surrounds it. Other materials, such as oxides, nitrides, metals or dielectrics, may be used in some instances. Materials including one or more of zirconium oxide ($ZnO_2$), tin oxide ($SnO_2$), indium oxide ($In_2O_3$), or tin nitride (TiN) can be used as the metamaterial 112 in some implementations In general, it is desirable that the metamaterial 112 have a relatively high index of refraction and relatively low optical loss.

Each meta-atom 114 may have the shape, for example, of a post, and the meta-atoms 114 may be arranged in a two-dimensional array. In some implementations, the meta-atoms 114 are strips arranged in a one-dimensional array. In some implementations, the meta-atoms 114 are arranged in other patterns, e.g., in concentric rings. Each meta-atom 114 composed, for example, of $TiO_2$ is laterally surrounded by the polymeric material 104 and adjacent meta-atoms are separated from one another by the polymeric material. Further, as noted above, a thin layer of polymeric material 104A may remain between the surface of the substrate 102 and the meta-atoms 114.

Figure 1G:
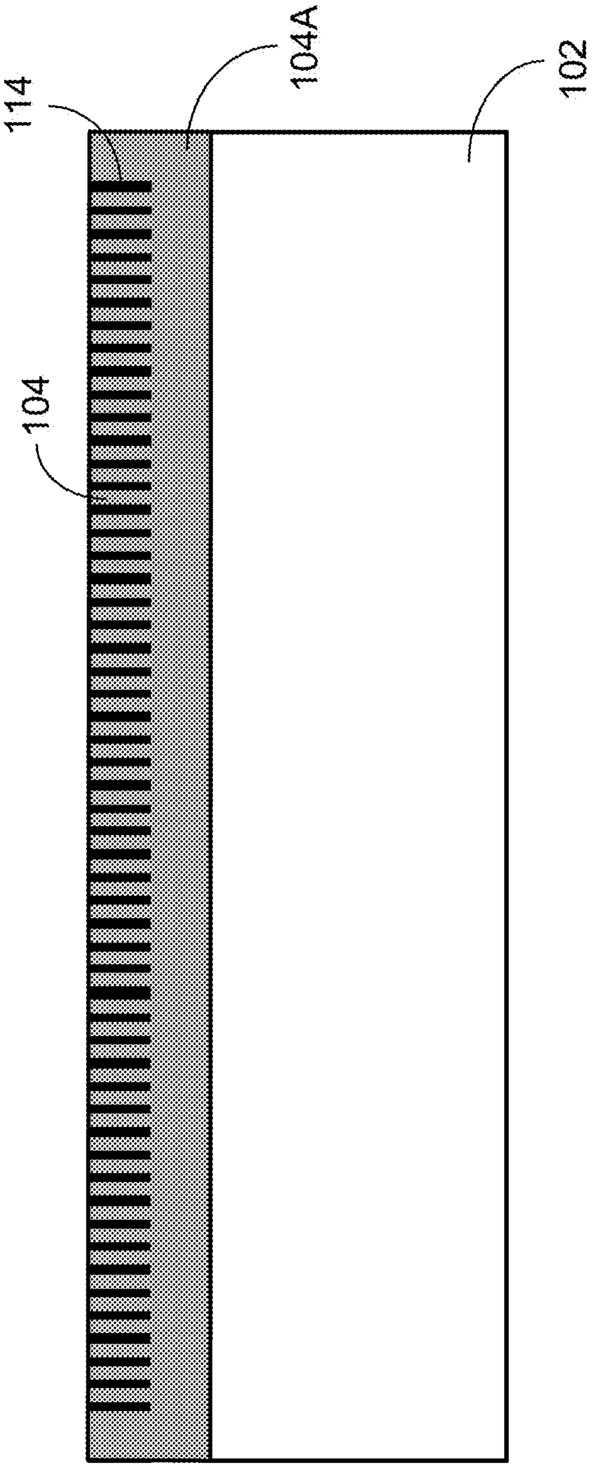

Next, as shown in FIG. 1G, the top layer of metamaterial 112 is removed, for example, by etching back the material to expose the meta-atoms 114 embedded in the polymeric layer 104. Suitable techniques for removing the top layer of metamaterial 112 include, for example, plasma etching, chemical etching or chemical-mechanical polishing (CMP).

Each resulting meta-atom 114 may have dimensions of, for example, tens of nanometers (nm) or hundreds of nm. In some implementations, each meta-atom 114 has a dimension between 10 nm and 100 nm. In some implementations, each meta-atom 114 has a dimension between 100 nm and 500 nm. In some implementations, each meta-atom 114 has a dimension of less than 1 μm. In some implementations, each meta-atom 114 has a dimension of less than 10 μm. In some cases, each meta-atoms has an aspect ratio of at least 1.6. In a particular example, the meta-atoms have a height of 1 μm±20-30%, and have a diameter in the range of 60-400 nm. The dimensions of the meta-atoms may differ for other implementations.

Figure 1H:
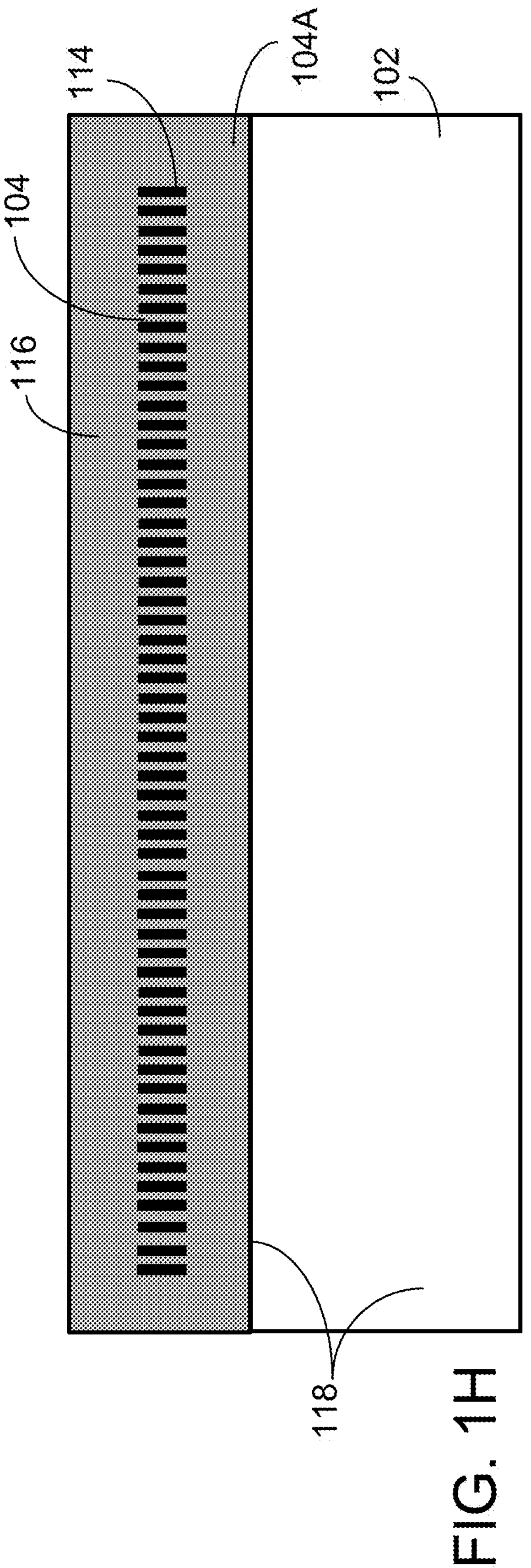

As shown in FIG. 1H, in some instances, a protective layer 116 then is deposited over the metastructure, including the meta-atoms 114. The layer 116 can help protect the metastructure from physical, chemical and/or environmental degradation. In some instances, the protective layer 116 is composed of a photoresist material that is spun on and then cured. Other materials such as polymers or spin-on glass may be used as well for the protective layer 116. Preferably, the protective layer 116 has a refractive index the same as, or substantially the same as that of the polymeric layer 104. In some cases, the thickness of the protective layer 116 is at least two times the wavelength of light for applications in which the metastructure is to be used.

Figure 2A:
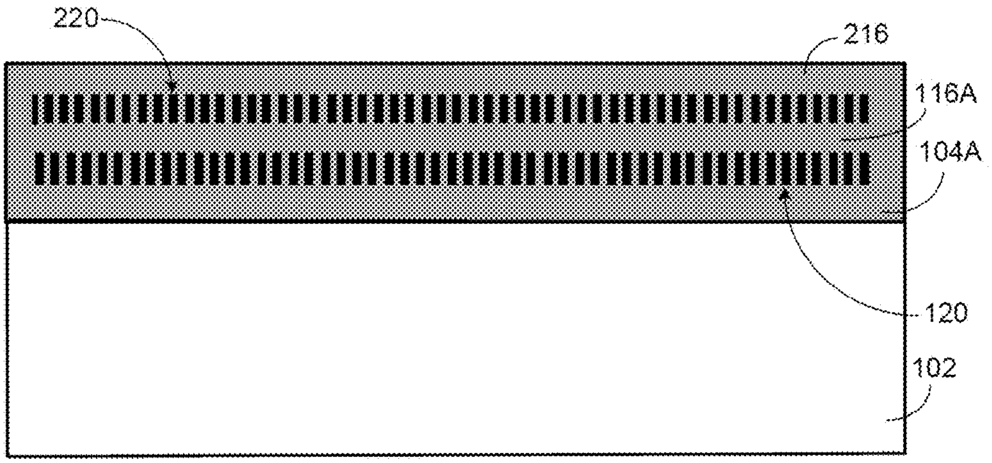
FIG. 2A shows an example of two embedded metastructures one over the other.
Figure 2B:
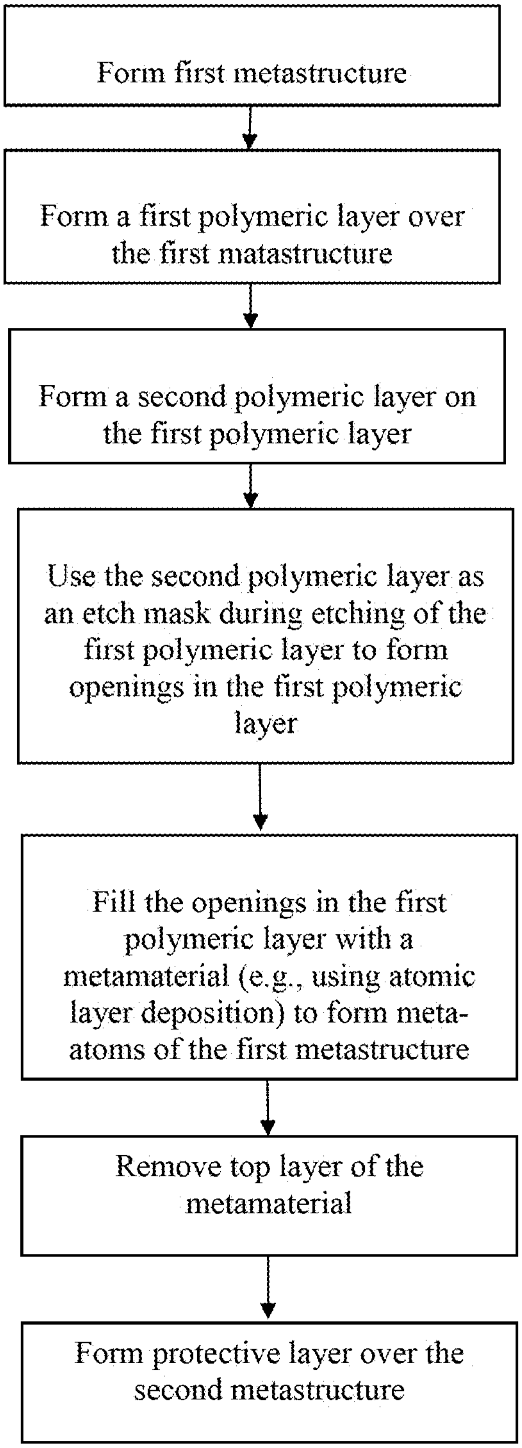
FIG. 2B is a flow chart illustrating a method of fabricating an optical device that includes multiple embedded metastructures.

In some cases, an optical device includes two metastructures, one over the other (see, e.g., FIGS. 2A and 2B). Formation of a first metastructure can be by substantially the same process as described in connection with FIGS. 1A-1H. Formation of the second metastructure is described in the following paragraphs.

Assuming, for example, that the layer 116 over the first metastructure is composed of a polymeric material, a further polymeric layer (e.g., photoresist) can be provided (e.g., by a spin-on process) on the polymeric layer 116. Then, a second metastructure can be formed in the protective polymeric layer 116 using substantially the same process as for formation of the first metastructure. In some implementations, formation of the second metastructure can include using a polymeric layer as a mask during etching of the underlying layer 116 to form an arrangement of openings in the polymeric layer 116 that correspond to the locations of the meta-atoms for the second metastructure. Here, as well, it can be advantageous to use an etchant that etches the layer 116 more quickly than it etches the overlying polymeric (e.g., photoresist) layer so as to facilitate formation of meta-atoms having a relatively high aspect ratio. Further details of forming the second metastructure in accordance with some implementations are described below.

After forming the openings in the layer 116, the operations described previously in connection with FIGS. 1F-1H can be substantially repeated. Thus, a metamaterial can be deposited over the polymeric layer 116 so as to fill the openings and form the individual meta-atoms of the second metastructure. The same or similar techniques (e.g., ALD), materials (e.g., $TiO_2$) and arrangements as described above in connection with formation of the meta-atoms for the first metastructure can be used for formation of the meta-atoms of the second metastructure. In this way, each meta-atom (e.g., 214 in FIG. 2A) of the second metastructure (e.g., 220 in FIG. 2A) can be surrounded laterally by a polymeric layer. Further, a thin layer of polymeric material (e.g., 116A in FIG. 2A) may remain between the first metastructure and the second metastructure. Other details regarding formation of the second metastructure may be the same as, or similar to, those for forming the first metastructure as described above in connection with FIGS. 1A-1H.

In some instances, a protective layer (e.g., 216 in FIG. 2A) may be deposited over the second metastructure. Such a protective layer can help protect the second metastructure from physical, chemical and/or environmental degradation. In some instances, the protective layer is composed of a photoresist material that is spun on and then cured. Other materials such as polymers or spin-on glass may be used as well for the protective layer. Preferably, the protective layer 216 has a refractive index the same as, or substantially the same as that of the underlying polymeric layer (e.g., 116 in FIG. 2A). In some cases, the thickness of the protective layer is at least two times the wavelength of light for applications in which the metastructure is to be used.

Figure 3:
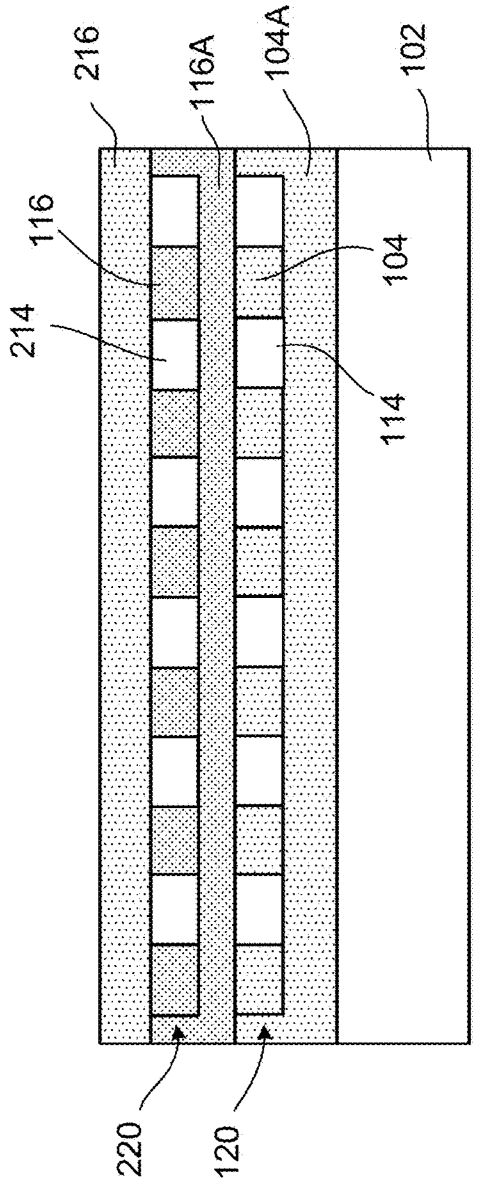
FIGS. 3-6 illustrate examples of optical devices that include embedded metastructures.

For devices that have multiple metastructures embedded in layers of polymeric material, the materials, dimensions and/or optical characteristics of the metastructures may be the same as one another or may differ from one another. FIG. 3 illustrates an example of an optical device having a first metastructure 120 and a second metastructure 220. The first metastructure 120 includes meta-atoms 114 laterally surrounded by portions of the first polymeric layer 104. The second metastructure 220 includes meta-atoms 214 laterally surrounded by portions of the first polymeric layer 116. The first metastructure 120 is separated from the substrate 102 by a portion 104A of the first polymeric layer 104, and the second metastructure 220 is separated from the first metastructure 120 by a portion 116A of the second polymeric layer 116. A protective polymeric or other layer 216 is disposed over (or in) the second metastructure 220 and can help provide protection from moisture and other physical, chemical and/or environmental degradation.

In some cases, the materials for the polymeric layers 104, 116 of FIG. 3 have different properties from one another. For example, they may have different coefficients of thermal expansion (CTE) and/or different glass transition temperatures (Tg). In some cases, the CTE of the first polymeric material is greater than the CTE of the second polymeric material. This feature may provide greater mechanical stability in some instances. Further, in some instances, the polymeric layers 104, 116 may be cured by different techniques. For example, in some cases, one of the polymeric layers may be cured by UV radiation, whereas another one of the polymeric layers may be cured thermally.

Figure 8:
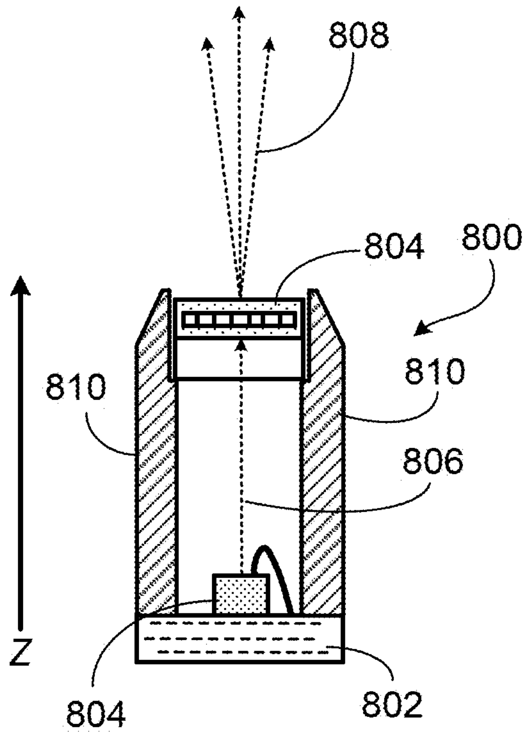
FIG. 8 illustrates an example of a light emitting module including an optical device having one or more metastructures.

In some implementations, the protective layer (i.e., 116 in FIG. 1H or 216 in FIG. 3) may be composed of a relatively hydrophobic or hydrophilic material. For example, where the top protective layer is hydrophilic and the metastructure device is incorporated as part of a light emitting module, the module may exhibit improved eye-safety (e.g., a water droplet would not act like a lens, but would spread out) the generated light). This feature can be useful, for example, where the metastructure device is incorporated into a module that has a laser or VCSEL as the light source (see, e.g., FIGS. 8, 10 and 11).

In some instances, the protective layer (i.e., 116 in FIG. 1H, or 216 in FIG. 3) can have an antireflective coating on its surface, or may be structured to provide a specified optical effect. In some instances, an anti-reflective coating can be provided on the back side of the metastructure. For example, as indicated in FIG. 1H, an anti-reflective coating 118 can be incorporated onto either the front and/or back side of the substrate 102.

Figure 4:
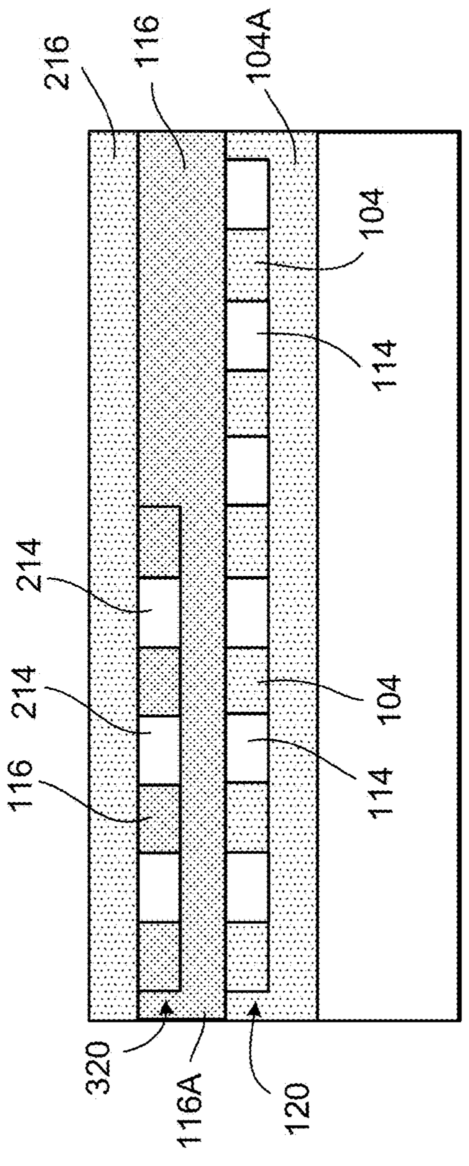

In the foregoing example of FIG. 3, the meta-atoms 114, 214 of the first and second metastructures 120, 220 may have substantially the same lateral dimensions, and the meta-atoms of one metastructure may be substantially aligned with respect to the meta-atoms of the other metastructure. In the example of FIG. 3, the second metastructure 220 completely overlaps the first metastructure 120. In other implementations, however, the overall lateral dimensions of the two metastructures may differ from one another. Thus, FIG. 4 illustrates an example in which the second metastructure 320 only partially overlaps the first metastructure 120. Further, in some instances, as shown in FIG. 5, the second metastructure 320 does not overlap the first metastructure 420 at all.

Figure 5:
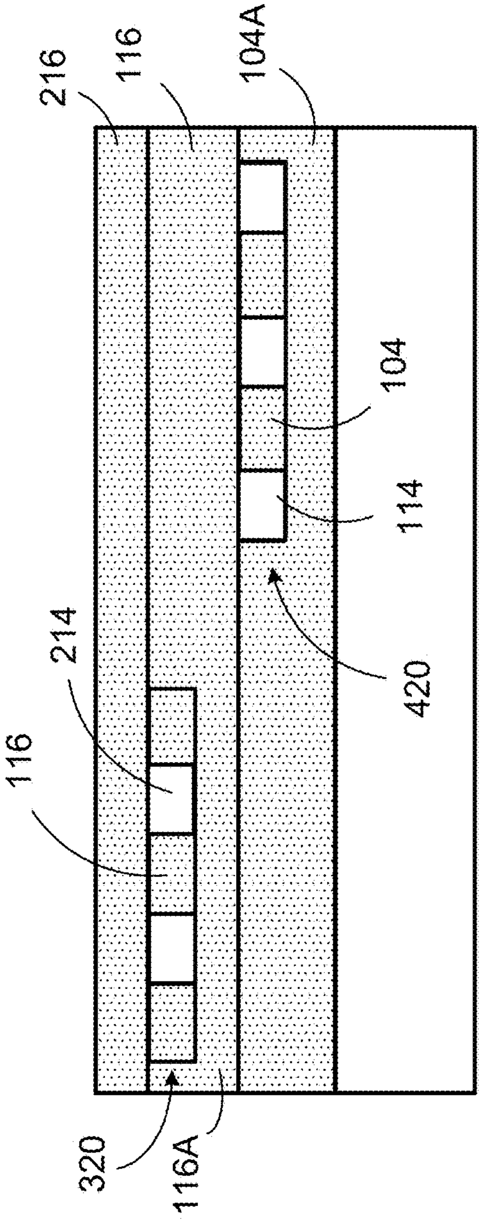
Figure 6:
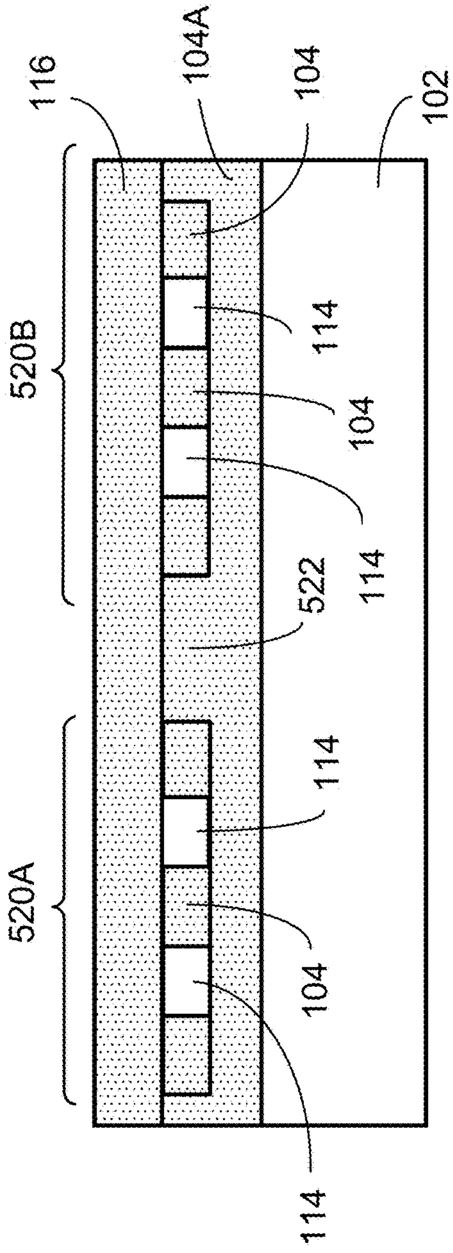

In the foregoing examples of FIGS. 3, 4 and 5, the first and second metastructures are in different planes from one another. In some instance, multiple metastructures 520A, 520B may be formed in the same plane as one another, but may be optically isolated from one another by an isolation region 522, as shown in the example of FIG. 6. Metal or other material for the isolation region 522 may be deposited, for example, on the substrate 102 prior to formation of the metastructures 520A, 520B. A mask or lift-off technique may be used to restrict the metal to the desired location. In other implementations, metal deposited on the backside of the substrate 102 may be provide optical isolation between the two metastructures 520A, 520B.

The foregoing optical devices can, in some cases, be fabricated using wafer-scale manufacturing processes, in other words, using processes that allow tens, hundreds or even thousands of optical devices to be manufactured in parallel at the same time.

In some implementations, optical devices incorporating one or more metastructures as described above may be integrated into modules that house one or more optoelectronic devices (e.g., light emitting and/or light sensing devices). The metastructure can be used to modify one or more characteristics (e.g., phase, amplitude, angle, etc.) of an emitted or incoming light wave as it passes through the metastructure.

Figure 7:
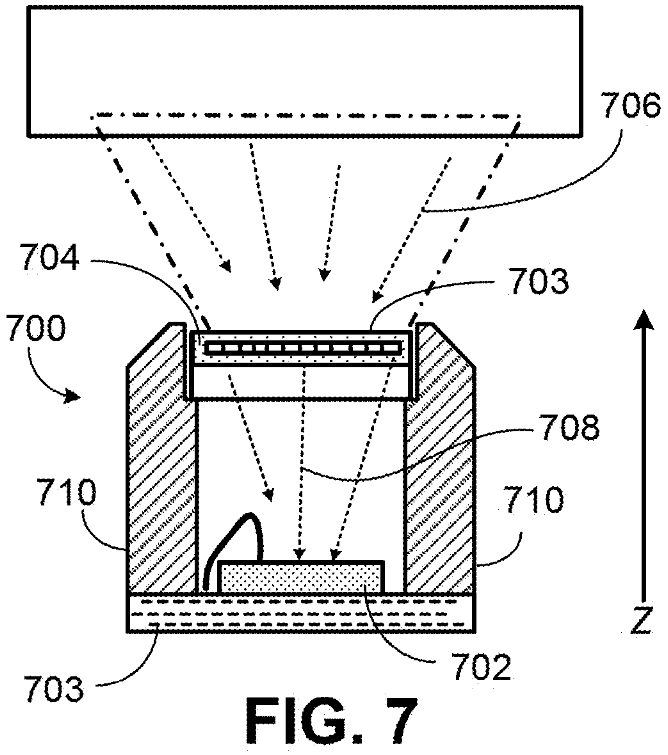
FIG. 7 illustrates an example of a light sensing module including an optical device having one or more metastructures.

As shown, for example, in FIG. 7, in some implementations, a light sensing module (for example, an ambient light sensor module) 700 includes a light sensor (e.g., a photodiode, a pixel, or an image sensor) 702 mounted on a substrate 703. Light 706 incident on the module 700 is modified by a metastructure device 704, which may be implemented, for example, in accordance with any of the metastructure devices described above in connection with FIGS. 1A through 6. For single-channel modules, such as the module 700, the implementations of a metastructure device shown in FIG. 1H or 3 may be particularly advantageous. The metastructure device 704 is disposed so as to intersect a path of the incoming light 706. The metastructure device 704 can modify one or more characteristics of the light 706 impinging on the metastructure device before the light 708 is received and sensed by the light sensor 702. In some instances, for example, the metastructure device 704 may focus patterned light onto the light sensor 702. In some instances, the metastructure device 704 may split, diffuse and/or polarize the light 706 before it is received and sensed by the light sensor 702. The module housing may include, for example, spacers 710 separating the light sensor 702 and/or the substrate 703 from the metastructure device 704. In some cases, the metastructure device 704 may help reduce the overall z-height of the module 700 compared to modules incorporating conventional optics, and may better protect the device in adverse environments.

In some implementations, a module 800 includes a substrate 802 and a light emitter 804 mounted on, or integrated in, the substrate 802. The light emitter 804 may include, for example, a laser (e.g., a vertical-cavity surface-emitting laser) or a light emitting diode. Light 806 generated by the light emitter 804 passes through a metastructure device 804 and out of the module. The metastructure device 804 may be implemented, for example, in accordance with any of the metastructure devices described above in connection with FIGS. 1A through 6. For single-channel modules, such as the module 800, the implementations of a metastructure device shown in FIG. 1H or 3 may be particularly advantageous. The metastructure device 804 is disposed so as to intersect a path of the outgoing light 806. The metastructure device 804 can modify one or more characteristics of the light 806 impinging on the metastructure before the light 808 exits the module 800. Thus, the metastructure device 804 is operable to modify the light 806, such that modified light 808 is transmitted out of the module 800. In some cases, the module 800 is operable to produce, for example, one or more of structured light, diffused light, and patterned light. The module housing may include, for example, spacers 810 separating the light emitter 804 and/or the substrate 802 from the metastructure device 804. In some instances, the module 800 is operable as a light generating module, e.g., as a structured light projector, a camera flash, a logo projecting module or as a lamp.

Figure 9:
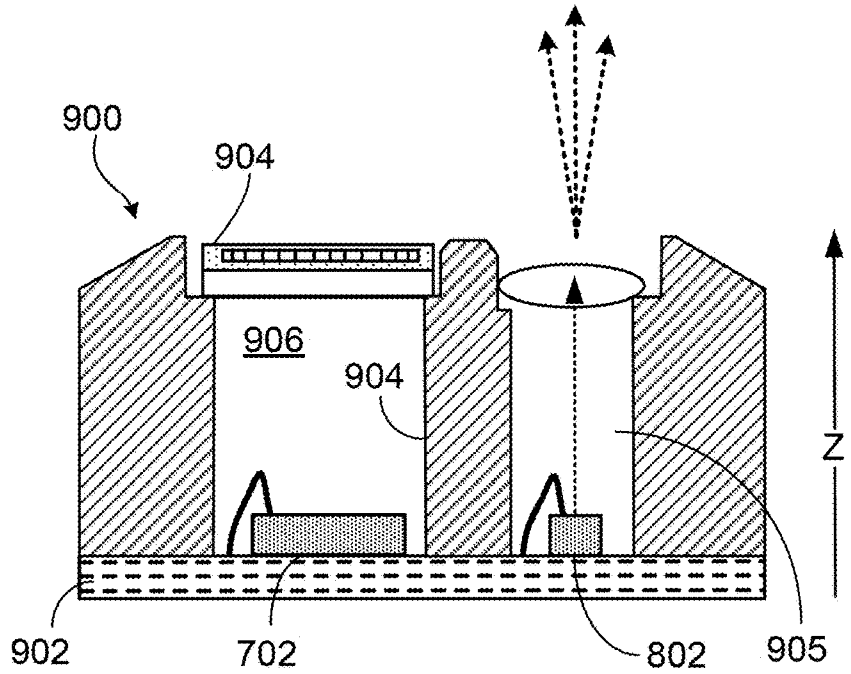
FIGS. 9-11 illustrate examples of multi-channel optoelectronic modules including an optical device having one or more metastructures.
Figure 10:
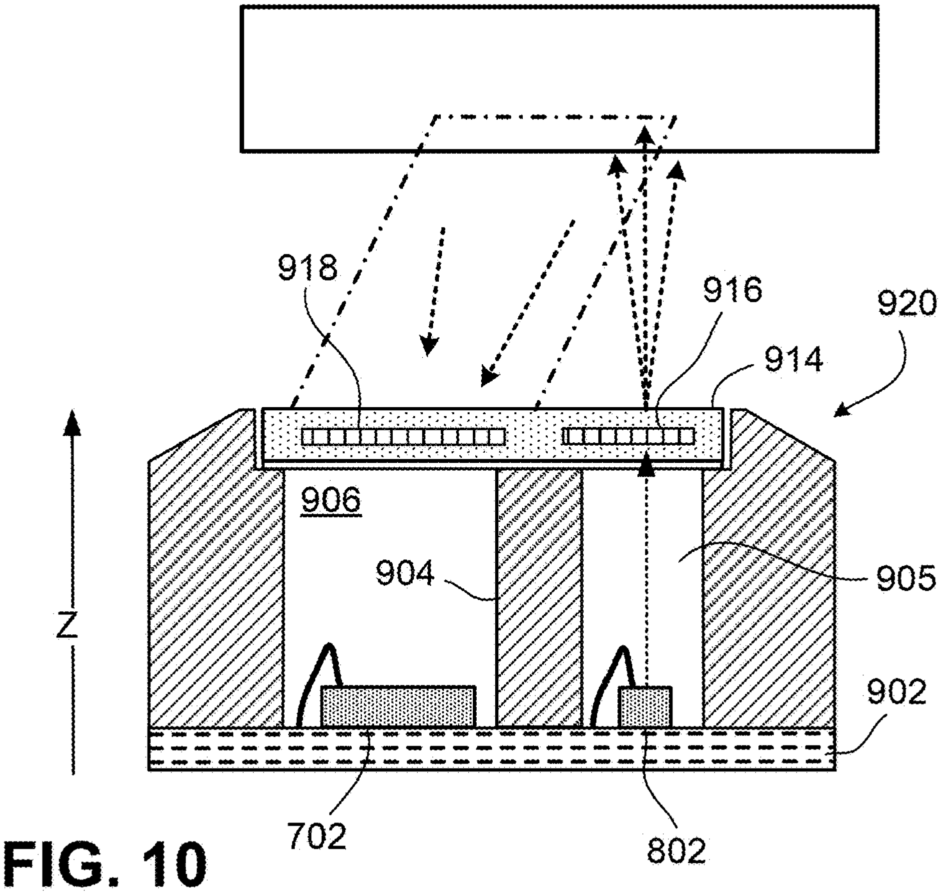
Figure 11:
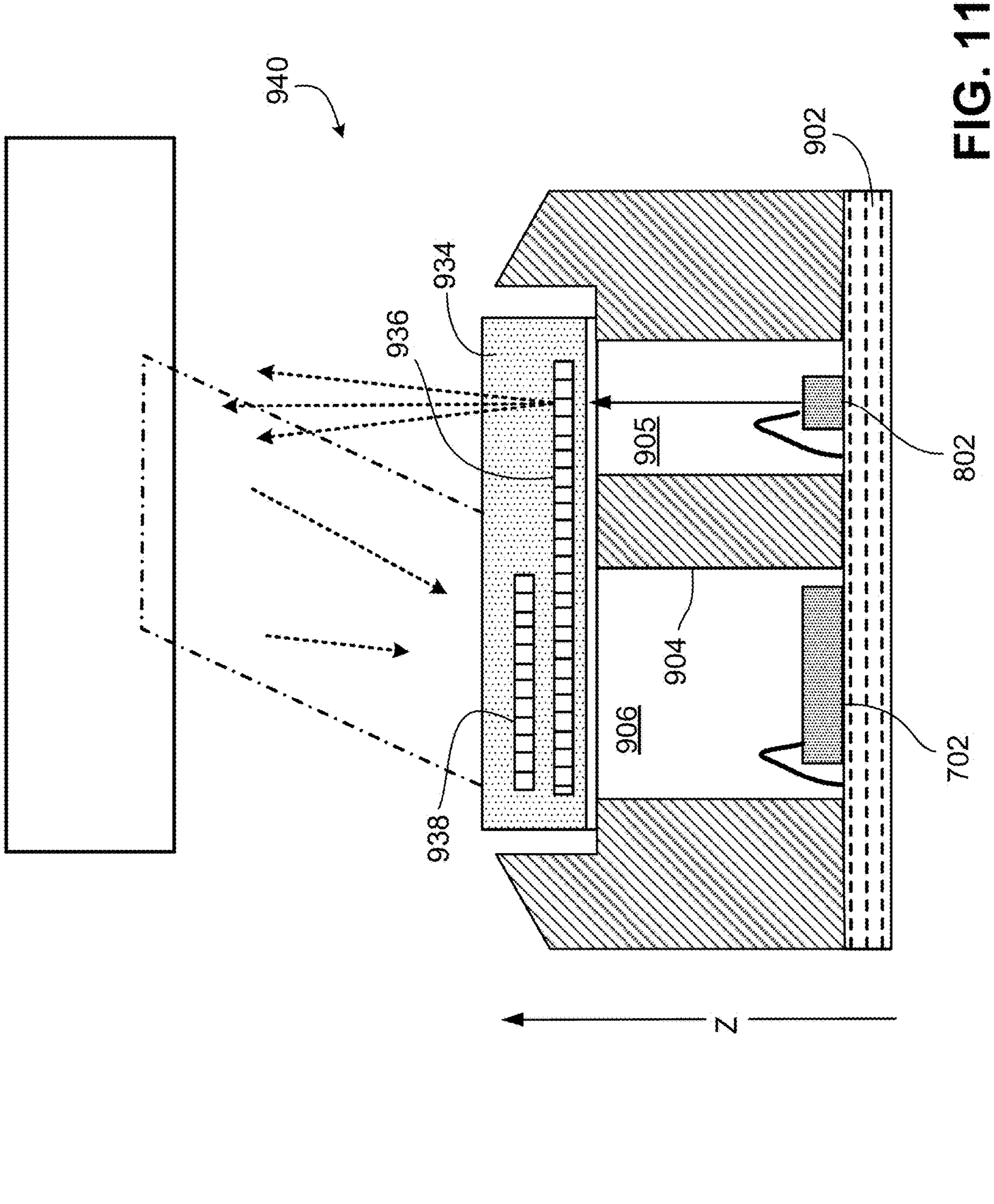

FIGS. 9, 10 and 11 illustrate examples of multi-channel modules that incorporate at least one metastructure device as described above. Each of the modules in FIGS. 9, 10 and 11 includes a light sensor 702 and a light emitter 802, both of which are mounted, for example, on the same printed circuit board (PCB) or other substrate 902. Each of the modules thus includes a light emission channel 905 and a light detection channel 906, which may be optically isolated from one another by a wall 904 that forms part of the module housing.

In some instances, the module includes a metastructure device over only one of the channels 905, 906. For example, as shown in FIG. 9, the module 900 includes a metastructure device 904 over the light detection channel 906, whereas there is a lens or other optical element disposed in the optical path of the of light emission channel 905. The metastructure device 904 may be implemented, for example, in accordance with any of the metastructure devices described above. In this case, as the metastructure device 904 extends over only a single optical channel, the implementations of a metastructure device shown in FIG. 1H or 3 may be particularly advantageous. In some instances, only the light emission channel 905 may have a metastructure device disposed over (or in) it so as to intersect the outgoing light, whereas the light detection channel may have a lens or other optical element disposed over (or in) it instead.

The implementation of FIG. 9 may be advantageous, for example, for situations in which one of the channels requires less complicated optics (requiring a smaller z-height) than the other channel. In some cases, the more complicated optics can be implemented by the metastructure. Consequently, the module may have a smaller overall z-height. The module can be, in some cases, a three-dimensional camera such as a time-of-flight (TOF) camera, a stereo camera with active stereo (which may need another light sensitive channel), a structured-light camera with a structured light projector, an ordinary camera with flash, or a proximity sensing module.

In some implementations, as shown in FIGS. 10 and 11, a single metastructure device spans across both channels 905, 906 such that each of the channels 905, 906 has at least one metastructure disposed over (or in) it. In some cases, as shown in FIG. 10, the metastructure device 914 includes first and second embedded metastructures 916, 918 in the same plane as one another. Thus, a first metastructure 916 is disposed over (or in) the emission channel 905, and a second, different metastructure 918 is disposed over (or in) the detection channel 906. In some implementations, the metastructure device of FIG. 6 is incorporated into the module 920 of FIG. 10. An advantage in some cases is that a single metastructure device 914 that spans both channels can be manufactured with better tolerances than if two separate metastructure devices were used, while at the same time allowing for each channel to have a respective metastructure tailored for its particular requirements.

In other implementations, as shown in the example of FIG. 11, the metastructure device 934 includes a first embedded metastructure 936 that spans both channels 905, 906, and a second embedded metastructure 938 that is disposed over (or in) only one of the channels (e.g., the light detection channel 906). Thus, one channel (e.g., the light detection channel 906) may have multiple embedded metastructures 936, 938 over (or in) the channel, whereas the other channel (e.g., the light emission channel 905) has only a single embedded metastructure 936 over (or in) the channel. In some implementations, the metastructure device of FIG. 4 is incorporated into the module 940 of FIG. 11. Here as well, an advantage in some cases is that a single metastructure device 934 that spans both channels can be manufactured with better tolerances than if two separate metastructure devices were used, while at the same time allowing for each channel to have a respective metastructure tailored for its particular requirements. Such an implementation can be advantageous, for example, when more complicated optics are needed for imaging and less complicated optics are needed for projecting light.

In some cases, in the implementations of FIG. 9, 10 or 11, the module may emit light that interacts with an object external to the module. Light reflected by the object then is received by the module, allowing the module to act, for example, as a proximity sensor or as a three-dimensional mapping device. When integrated into such a module, the metastructure device may provide one or more of the advantages described for the modules above.

Although the examples of FIGS. 9-11 illustrate modules having two optical channels, optical devices as described above also can be incorporated into modules having more than two optical channels. In some cases, the optical device may span across all the optical channels, whereas in other cases the optical device may span across fewer than all the channels. Respective metastructures in the optical device may be disposed so as to intersect incoming or outgoing light from one or more of the optical channels.

Figure 12:
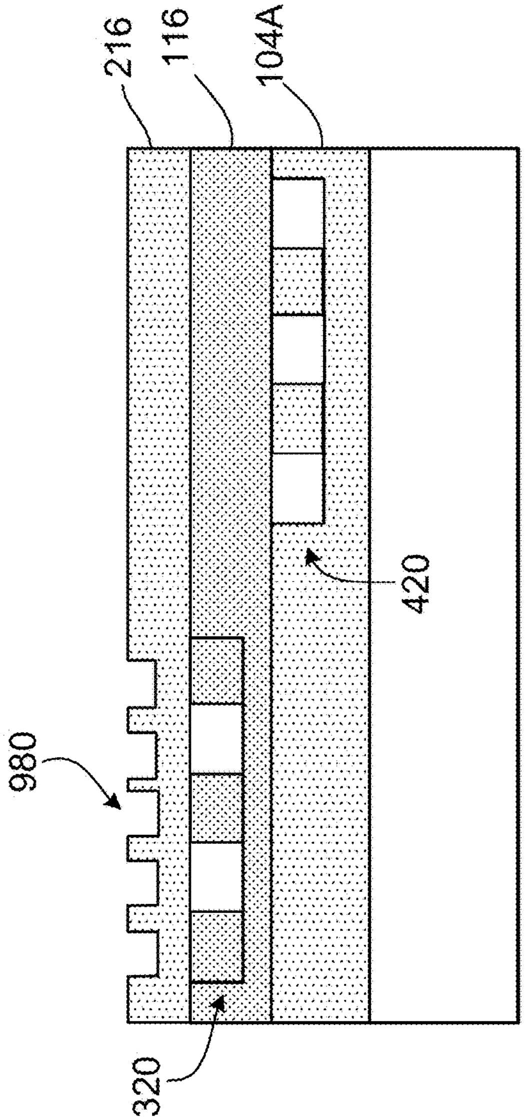
FIGS. 12-13 illustrate examples of optical devices including metastructures and integrated diffractive optical elements.
Figure 13:
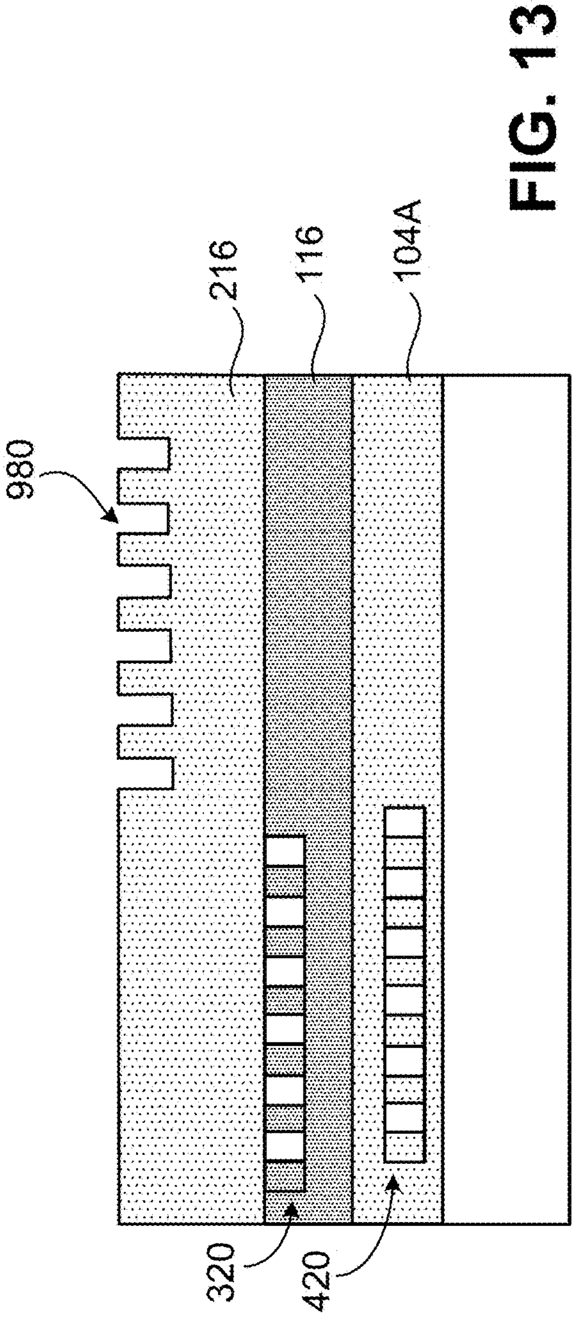

In some instances, a diffractive optical element (DOE) can be replicated into the top polymeric layer of the metastructure device. An example is shown in FIG. 12, which is similar to the metastructure of FIG. 5, but also includes a DOE replicated into the upper polymeric layer 216. Another example is shown in FIG. 13. The implementation of FIG. 13 can be useful, for example, in two-channel embodiments of modules where one channel includes a light source and a simple optic (i.e., the DOE) is needed for illuminating a scene, and the other channel includes an image sensor where more complicated optics are needed (i.e., the metastructures).

In some instances, the modules described above may be integrated into mobile phones, laptops, televisions, wearable devices, or automotive vehicles.

Various aspects of the subject matter and the functional operations described in this specification can be implemented in digital electronic circuitry, or in computer software, firmware, or hardware, including the structures disclosed in this specification and their structural equivalents, or in combinations of one or more of them. Thus, aspects of the subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The apparatus can include, in addition to hardware, code that creates an execution environment for the computer program in question, e.g., code that constitutes processor firmware.

Although particular implementations have been described in detail, various modifications can be made. Accordingly, other implementations are within the scope of the claims.

What is claimed is:

1. An optical device comprising:

a substrate comprising a surface;

a first metastructure disposed on the surface of the substrate, wherein the first metastructure includes a first plurality of meta-atoms separated from one another by a first polymeric material, wherein each of the meta-atoms of the first plurality of meta-atoms has an aspect ratio of at least 1.6, wherein a width of the plurality of meta-atoms within the first metastructure varies, and wherein the first metastructure is configured to function as a lens, a lens array, a beam splitter, a diffuser, or a bandpass filter; and a second metastructure disposed above the first metastructure, wherein the second metastructure includes a second plurality of meta-atoms separated from one another by a second polymeric material, wherein the first polymeric material and the second polymeric material have different coefficients of thermal expansion, different glass transition temperatures, or both different coefficients of thermal expansion and different glass transition temperatures.

2. The optical device of claim 1 wherein the first polymeric material comprises poly(methyl methacrylate).

3. The optical device of claim 1 wherein the meta-atoms are composed of titanium dioxide.

4. The optical device of claim 1 wherein the substrate is composed of fused silica.

5. A module comprising:

a housing;

an optoelectronic component operable to emit or sense light, wherein the optoelectronic component is disposed within the housing; and an optical device of claim 1, wherein the optical device is disposed over the optoelectronic component.

6. The module of claim 5 wherein the optoelectronic component is a light emitter, and wherein the optical device is disposed so as to intersect a path of light emitted by the light emitter.

7. The module of claim 5 wherein the optoelectronic component is a light sensor, and wherein the optical device is disposed so as to intersect a path of light entering the module for sensing by the light sensor.

8. The module of claim 5 including a plurality of optical channels, wherein the optical device spans across one of the optical channels.

9. The module of claim 5 including a plurality of optical channels, wherein the optical device spans across each of the optical channels.

10. The optical device of claim 1, wherein the coefficient of thermal expansion of the first polymeric material is greater than the coefficient of thermal expansion of the second polymeric material.

11. The optical device of claim 1, wherein the second metastructure does not overlap the first metastructure in a vertical direction extending orthogonal to the surface of the substrate.

* * * * *